United States Patent
Nakai

(10) Patent No.: US 8,361,824 B2
(45) Date of Patent: Jan. 29, 2013

(54) METHOD FOR FORMING LENS, METHOD FOR MANUFACTURING SEMICONDUCTOR APPARATUS, AND ELECTRONIC INFORMATION DEVICE

(75) Inventor: Junichi Nakai, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 416 days.

(21) Appl. No.: 12/799,994

(22) Filed: May 5, 2010

(65) Prior Publication Data

US 2010/0289034 A1 Nov. 18, 2010

(30) Foreign Application Priority Data

May 12, 2009 (JP) ................. 2009-116016

(51) Int. Cl.
*H01L 21/00* (2006.01)
*H01L 27/00* (2006.01)
*H01L 27/148* (2006.01)
*G02F 1/1335* (2006.01)
*H01J 5/14* (2006.01)

(52) U.S. Cl. .............. 438/48; 438/60; 438/65; 257/219; 257/225; 257/239; 257/241; 257/246; 257/E27.082; 257/E27.083; 257/E27.15; 250/208.1; 250/216; 250/226; 349/95; 345/87

(58) Field of Classification Search .................. 257/219, 257/225, 239, 240, 241, 246, E27.082, E27.083, 257/E27.15; 438/48, 60, 65; 250/208.1, 216, 226; 345/87; 349/95

See application file for complete search history.

(56) References Cited

U.S. PATENT DOCUMENTS

| | | | |
|---|---|---|---|
| 2007/0020559 A1* | 1/2007 | Hatanaka | 430/270.1 |
| 2007/0097293 A1* | 5/2007 | Nakanishi et al. | 349/95 |
| 2008/0068441 A1* | 3/2008 | Abe et al. | 347/254 |
| 2009/0206430 A1* | 8/2009 | Higuchi et al. | 257/432 |

FOREIGN PATENT DOCUMENTS

| | | |
|---|---|---|
| JP | 2945440 A | 1/1992 |
| JP | 3158296 A | 6/1993 |
| JP | 2004-070087 A | 3/2004 |

* cited by examiner

*Primary Examiner* — Long Tran
(74) *Attorney, Agent, or Firm* — Edwards Wildman Palmer LLP; David G. Conlin; Edmund J. Koundakjian

(57) ABSTRACT

A lens forming method according to the present invention for forming lenses capable of focusing light on a plurality of respective photoelectric conversion sections constituting of a semiconductor apparatus is described. The method includes a lens forming step of processing a lens forming material, in which an average gradient of a γ curve indicating a residual film thickness with respect to the amount of irradiation light is between −15 and −0.8 nm·cm$^2$/mJ within the range of a residual film ratio of 10 to 50% or within the range of the amount of irradiation light of 55 to 137 mJ/cm$^2$ into a lens surface shape, using a photomask with an optical transmittance that is varied according to a lens surface shape, as an exposure mask.

21 Claims, 7 Drawing Sheets average gradient of $\gamma$ curve
= [(residual film thickness at the time of 50% residual film thickness) to (residual film thickness at the time of 10% residual film thickness)]

(a)

(b)

(a)

(b)

*Prior Art*

*Prior Art*

METHOD FOR FORMING LENS, METHOD FOR MANUFACTURING SEMICONDUCTOR APPARATUS, AND ELECTRONIC INFORMATION DEVICE

This nonprovisional application claims priority under 35 U.S.C. §119(a) to Patent Application No. 2009-116016 filed in Japan on May 12, 2009, the entire contents of which are hereby incorporated by reference.

BACKGROUND OF THE INVENTION

1. Field of the Invention

The present invention relates to a method for forming a lens at a position corresponding to a photoelectric conversion section for converting light to an electric signal and/or converting an electric signal to light. The present invention further relates to a method for manufacturing a semiconductor apparatus such as a solid-state image capturing element, which uses the lens formed using the method for forming a lens and which is constituted of a plurality of light receiving sections for performing a photoelectric conversion on and capturing an image of incident light, as well as a light emitting section and a light receiving section. The present invention further relates to an electronic information device, such as a digital camera (e.g., a digital video camera or a digital still camera), an image input camera (e.g., a monitoring camera and a car-mounted camera), a scanner, a facsimile machine, a television telephone device, a camera-equipped cell phone device; which electronic information device includes the solid-state image capturing element, being the semiconductor apparatus manufactured using the method for manufacturing a semiconductor apparatus, as an image input device used in an image capturing section thereof; or relates to an electronic information device such as a pick-up apparatus, including the light emitting section and light receiving section as the semiconductor apparatus in an information recording and reproducing section thereof.

2. Description of the Related Art

Solid-state image capturing apparatuses, as conventional semiconductor apparatuses of this type, include CCD (Charge Coupled Device) image sensors and CMOS (Complementary Metal Oxide Semiconductor) image sensors and the like. These apparatuses are applied to various kinds of devices including a digital camera, a video camera, a scanner, a digital copying machine, a facsimile machine, or a camera-equipped cell phone device.

Further, with the spread of products of the conventional solid-state image capturing apparatus, demands have been increasing for the reduction of size and lowering of price in addition to higher performance such as increasing the number of pixels and improving light receiving sensitivity.

When advancements are made in reducing the size and increasing the number of pixels in the conventional solid-state image capturing apparatus and at the same time, the lowering of the price is demanded, the pixel size is reduced even more. Along such a reduction of the pixel size, one aspect of the fundamental performance of the solid-state image capturing apparatus: the light receiving sensitivity is lowered. This makes it difficult to capture a clear image in low luminous intensity. As a result, it is an important issue of how to improve the light receiving sensitivity per unit pixel.

Accordingly, for a method of improving the light receiving sensitivity of the conventional solid-state image capturing apparatus, a microlens is provided as a light focusing convex lens for each light receiving section in order to increase the light focusing efficiency of the light receiving section. There exist various kinds of methods for manufacturing such a microlens. As a first method in the conventional technique, Reference 1 discloses a method for forming a microlens in a desired shape with suitable reproducibility and at a low cost.

The method for forming a microlens disclosed in Reference 1 will be described with reference to FIGS. 6 and 7.

FIG. 6 is an essential part longitudinal cross sectional view illustrating a microlens forming step of a conventional CCD disclosed in Reference 1. FIG. 7 is an essential part longitudinal cross-sectional view of the CCD, illustrating a null region (distance X) between microlenses that are formed through the microlens forming step in FIG. 6.

As illustrated in FIGS. 6 and 7, each pixel section of a conventional CCD 100 includes: a semiconductor substrate 101; a photodiode section 102 provided on the semiconductor substrate 101, for performing a photoelectric conversion on incident light to generate a signal charge, as a light receiving element; and an electric charge transferring section 104 adjacent to each photodiode section 102, for reading out and transferring the signal charge in a predetermined direction from the photodiode section 102 through a read-out gate section 103.

In addition, above the read-out gate section 103 and electric charge transferring section 104, a gate electrode 105 is disposed with a gate insulation layer 106 interposed therebetween. The gate electrode 105 functions as an electric charge transferring electrode for controlling the transferring of electric charges.

Above the gate electrode 105, a light shielding layer 107 is formed with a gate insulation layer 108 interposed therebetween, for preventing noise (smear) from generating due to the reflection of incident light from the gate electrode 105. Above the photodiode section 102 (light receiving section), an inner-layer lens 110 is disposed for focusing light from an interlayer insulation layer 109 through an opening 107a of the light shielding layer 107 to the photodiode section 102. Further, a planarization layer 111 is formed on the inner-layer lens 110.

A thermoplastic resin for the microlens is applied on the planarization layer 111, wherein the resin has photosensitive and thermosetting characteristics. As such, the thermoplastic resin layer for the microlens, applied on the planarization layer 111, is exposed to be developed using a photomask of a predetermined pattern. As illustrated in FIG. 6, a thermoplastic resin layer 112 of a rectangular pattern form is thus formed at a position corresponding to each light receiving section. Thereafter, an appropriate amount of ultraviolet rays are irradiated onto the thermoplastic resin layer 112 in order to increase the transparency thereof.

Then, the thermoplastic resin layer 112 is heated to the temperature of the softening point or above to be thermally flowed. The thermoplastic resin layer 112 is further heated to at or above the temperature of the hardening point to form a microlens 112a with a desired convex lens shape as illustrated in FIG. 7, owing to the balance among the surface tension of the thermoplastic resin layer 112, the gravity acting thereon, and the curing characteristics of the thermoplastic resin layer 112. In addition, note that 113 denotes a stopper layer for separating elements.

Next, a method for forming a microlens by transferring disclosed in Reference 2 will be described in detail with reference to FIG. 8.

FIG. 8 is a longitudinal cross sectional view illustrating an exemplary structure of an essential part of a conventional CCD disclosed in Reference 2. Note that the members having the same function and effect as the corresponding constituent members in FIG. 7 are added with the same reference numerals, but their explanations will be omitted.

As illustrated in FIG. 8, a CCD 120 of Reference 2 is provided with a microlens resin layer 121 on a planarized layer 111 and the resin layer is planarized. A photosensitive resist layer material is applied on the microlens resin layer 121. Further, using a photomask formed with a light shielding layer pattern with a gradually changed dot density, an applied photosensitive resist layer is exposed and developed to form a photosensitive resist layer 122 which is patterned in a microlens shape. Then, an entire wafer surface including the photosensitive resist layer 122 is subjected to an atmosphere in which an organic layer is etched (etch back method), to transfer the shape of the photosensitive resist layer 122, which is patterned as the above-described microlens shape, to the microlens resin layer 121 below. At the same time with the transferring, the photosensitive resist layer 122 is removed.

Next, a method for forming a microlens disclosed in Reference 3 will be described in detail with reference to FIG. 9.

FIG. 9 is a longitudinal cross sectional view illustrating an exemplary structure of an essential part of a conventional CCD disclosed in Reference 3. Note that the members having the same function and effect as the corresponding constituent members in FIG. 7 are added with the same reference numerals, but their explanations will be omitted.

Reference 3 discloses a photomask and a method for preparing pattern data with the photomask. As illustrated in FIG. 9, the following is performed to form a microlens 132 on a planarized layer 111 in a CCD 130 of Reference 3: a resist in which remaining film thickness varies in accordance with the amount of exposure is used for development; an exposure amount distribution of a photomask pattern is determined to obtain a desired profile; a photomask pattern forming plane is defined with X-Y coordinates; coordinate values x and y are defined as a function; an aimed transmitted light amount (exposure amount) distribution of a photomask is expressed as a value z on a z-coordinate which is orthogonal to the pattern forming plane (coordinate values x and y); the positioning of a dot pattern is determined by this process of realizing the transmitted light amount (exposure amount) distribution; and a process of generating and positioning the dot pattern is performed on a region in the X-Y coordinates, where the pattern is determined to be positioned.

Accordingly, by using the method of preparing pattern data to form a photomask for the manufacturing of a minute light-focusing lens array (microlens 132) on the upper side of a light receiving section of an image sensor, such as CCD and CMOS image sensors, it becomes possible to manufacture a photomask which is capable of forming an aimed resist shape after development with suitable reproducibility and accuracy.
Reference 1: Japanese Patent No. 2945440
Reference 2: Japanese Patent No. 3158296
Reference 3: Japanese Laid-Open Publication No. 2004-70087

SUMMARY OF THE INVENTION

The conventional microlenses described above however cause the following problems (1) to (3).
(1) Problem of the First Method for Forming a Microlens in Reference 1

The subject method uses thermoplastic resin material with photosensitive and thermosetting characteristics as a microlens material, as illustrated in FIG. 6; and processes the surface of the thermoplastic resin layer 112, in which the thermoplastic resin material is patterned in a predetermined shape, into a convex lens shape by thermal flow, as a microlens 112a illustrated in FIG. 7. As a result, a null region of a certain distance (distance X) needs to be set in between adjacent microlenses 112a. Otherwise, the distance between adjacent microlenses 112a may become short even partially during thermal flow so that respective edge portions of the microlenses 112a may contact with each other to be united. In such cases, the connected lens portions will be pulled by each other and deformed during curing, resulting in the variation of light focusing efficiency in the subject portion of the microlenses 112a from the periphery. This will certainly cause a pixel defect in the photodiode 102 of the CCD 100. While stable manufacturing will be possible if a longer distance is used for the certain distance X, the null region (distance X) will increase in between the microlenses 112a on the contrary, lowering the light focusing efficiency of microlenses 112a. This will prevent the photodiode 102 of the CCD 100 from obtaining desired sensitivity. In particular, with the advance of reducing the size and increasing the number of pixels in the CCD 100, the pixel size becomes smaller and thus the reduction of the above-described null region (distance X) becomes a more important issue.
(2) Problem of the Second Method for Forming a Microlens by Transferring in Reference 2

Expensive equipment such as an anisotropic ion etching apparatus is necessary to use an etch back method for forming a microlens. Further, as illustrated in FIG. 8, it is extremely difficult to find a condition which allows to simultaneously obtain uniform longitudinal and transverse etching features of the microlens resin layer 121 and the photosensitive resist layer 122, and it is difficult to obtain a desired lens surface shape. Moreover, pattern defects are easily caused due to dust during etching, which may also lead to a problem of lowering the yield of the microlens forming.
(3) Problem of the Third Method for Forming a Microlens in Reference 3

Reference 3 discloses a method for manufacturing a photomask. Even if a resist, in which the remaining film thickness varies in accordance with the amount of exposure is used, a problem arises, as illustrated in FIG. 9, that it is difficult to obtain a desired lens surface shape in accordance with the required performance of a device.

The present invention is intended to solve the conventional problems described above. An objective of the present invention is to provide a method for forming a lens which is capable of forming a high quality and high performance microlens with suitable reproducibility and at a low cost, wherein the method allows to easily obtain a desired lens surface shape in accordance with the required performance of a device and to improve light focusing efficiency. Another objective of the present invention is to provide a method for manufacturing a semiconductor apparatus, such as a solid-state image capturing apparatus, wherein the apparatus uses therein a lens formed using the method for forming a lens and is constituted of a semiconductor element for performing a photoelectric conversion on and capturing an image of image light of a subject. Still, an objective of the present invention is to provide: an electronic information device, such as a camera-equipped cell phone device, including the solid-state image capturing element, as the semiconductor apparatus manufactured using the method for manufacturing a semiconductor apparatus, as an image input device used in an image capturing section thereof; or an electronic information device, such as a pick-up apparatus, including the light emitting section and light receiving section as the semiconductor apparatus in an information recording and reproducing section thereof.

A lens forming method for forming lenses capable of focusing light on a plurality of respective photoelectric conversion sections constituting of a semiconductor apparatus according to the present invention includes a lens forming step of processing a lens forming material, in which an average gradient of a γ curve indicating a residual film thickness with respect to an amount of irradiation light is between −15 and −0.8 nm·cm$^2$/mJ within a range of a residual film ratio of 10 to 50% into a lens surface shape, using a photomask with an optical transmittance that is varied according to the lens surface shape, as an exposure mask, thereby achieving the objective described above.

A lens forming method for forming lenses capable of focusing light on a plurality of respective photoelectric conversion sections constituting of a semiconductor apparatus according to the present invention includes a lens forming step of processing a lens forming material, in which an average gradient of a γ curve indicating a residual film thickness with respect to an amount of irradiation light is between −15 and −0.8 nm·cm$^2$/mJ within a range of an amount of irradiation light of 55 to 137 mJ/cm$^2$ into a lens surface shape, using a photomask with an optical transmittance that is varied according to the lens surface shape, as an exposure mask, thereby achieving the objective described above.

Preferably, in a lens forming method according to the present invention, the method uses the lens forming material, in which the average gradient of the γ curve is between −15 and −2 nm·cm$^2$/mJ.

Still preferably, in a lens forming method according to the present invention, the method uses the lens forming material, in which the average gradient of the γ curve is between −10 and −2 nm·cm$^2$/mJ. Still preferably, in a lens forming method according to the present invention, the method uses the lens forming material, in which the average gradient of the γ curve is between −15 and −3 nm·cm$^2$/mJ.

Still preferably, in a lens forming method according to the present invention, the photomask is made of a dot pattern that is finer than an exposure wavelength, and cannot be resolved with the exposure wavelength used for forming the lens.

Still preferably, in a lens forming method according to the present invention, the exposure wavelength is an i-ray of a 365 nm exposure wavelength for forming the lens.

A method for manufacturing a semiconductor apparatus according to the present invention includes: a photoelectric conversion sect ion forming step of forming a photoelectric conversion section for each pixel by selectively performing impurity ion implantation on a predetermined region in a semiconductor substrate; agate electrode forming step of forming a gate electrode for transferring a signal charge from the photoelectric conversion section, on a predetermined region adjacent to the photoelectric conversion section of the semiconductor substrate with a gate insulation layer interposed therebetween; a planarization layer forming step of forming a planarization layer above the gate electrode and the gate insulation layer with an interlayer insulation layer interposed therebetween; and a lens forming step in the lens forming method according to the present invention, of forming a lens on the planarization layer, thereby achieving the objective described above.

A method for manufacturing a semiconductor apparatus according to the present invention includes: a diffusion region forming step of forming, for each pixel, a photoelectric conversion section, a read-out gate section, a transfer channel section, and a channel stopper section in this order adjacent to each other by selectively performing impurity ion implantation on a predetermined region in a semiconductor substrate; a gate electrode forming step of forming a gate electrode for reading out a signal charge from the photoelectric conversion section through the read-out gate section to the transfer channel section for electric charge transferring, above the read-out gate section and the transfer channel section with a gate insulation layer interposed therebetween; a light shielding layer forming step of forming a light shielding layer which is formed above the gate electrode with an interlayer insulation layer interposed therebetween and covers up to and including an end surface side of the gate electrode and has an opening above the photoelectric conversion section; a planarization layer forming step of forming a planarization layer above the gate insulation layer and the light shielding layer with an interlayer insulation layer interposed therebetween; and a lens forming step in the lens forming method according to the present invention, of forming a lens on the planarization layer, thereby achieving the objective described above.

Preferably, a method for manufacturing a semiconductor apparatus according to the present invention further includes an inner-layer lens forming step of forming an inner-layer lens between the interlayer insulation layer and the planarization layer in the planarization layer forming step.

Still preferably, a method for manufacturing a semiconductor apparatus according to the present invention further includes a lens forming step in the lens forming method according to the present invention, of forming an inner-layer lens on a surface of the interlayer insulation layer in the planarization layer forming step after the surface is planarized, as an inner-layer lens forming step.

Still preferably, a method for manufacturing a semiconductor apparatus according to the present invention further includes a color filter forming step of forming, between the planarization layer and the lens, a color filter with a predetermined color arrangement and a planarization layer thereon for each pixel.

Still preferably, in a method for manufacturing a semiconductor apparatus according to the present invention, the method manufactures a CMOS type solid-state image capturing element including disposed therein a plurality of light receiving sections for performing a photoelectric conversion on and capturing an image of image light from a subject.

Still preferably, in a method for manufacturing a semiconductor apparatus according to the present invention, the method manufactures a CCD type solid-state image capturing element including disposed therein a plurality of light receiving sections for performing a photoelectric conversion on and capturing an image of image light from a subject.

Still preferably, in a method for manufacturing a semiconductor apparatus according to the present invention, the method manufactures a light emitting element for emitting output light and a light receiving element for receiving incident light.

An electronic information device according to the present invention includes a light emitting element and a light receiving element manufactured using the method for manufacturing a semiconductor apparatus according to the present invention, used in an information recording and reproducing section thereof, thereby achieving the objective described above.

An electronic information device according to the present invention includes a solid-state image capturing element manufactured using the method for manufacturing a semiconductor apparatus according to the present invention, used as an image input device in an image capturing section thereof, thereby achieving the objective described above.

The functions of the present invention having the structures described above will be described hereinafter.

According to the present invention, in a lens forming method for forming lenses capable of focusing light on a plurality of respective photoelectric conversion sections constituting of a semiconductor apparatus, the method comprising a lens forming step of processing a lens forming material, in which an average gradient of a γ curve indicating a residual film thickness with respect to the amount of irradiation light is between −15 and −0.8 nm·cm$^2$/mJ within the range of a residual film ratio of 10 to 50%, using a photomask with an optical transmittance that is varied according to a lens surface shape, as an exposure mask. Alternatively, in a lens forming method for forming lenses capable of focusing light on a plurality of respective photoelectric conversion sections constituting of a semiconductor apparatus, the method comprising a lens forming step of processing a lens forming material, in which an average gradient of the γ curve indicating a residual film thickness with respect to the amount of irradiation light is between −15 and −0.8 nm·cm$^2$/mJ within the range of the amount of irradiation light of 55 to 137 mJ/cm$^2$ into a lens surface shape, using a photomask with an optical transmittance that is varied according to the lens surface shape, as an exposure mask.

Accordingly, in a method for manufacturing a semiconductor apparatus, such as a solid-state image capturing element having a lens, a camera-equipped liquid crystal display element used in a television telephone apparatus and the like, and a pick-up apparatus and the like, a lens forming material is used, in which the average gradient of the γ curve of a positive type photosensitive resist material is between −15 and −0.8 nm·cm$^2$/mJ within the range of a residual film ratio of 10 to 50% or within the range of the amount of irradiation light of 55 to 137 mJ/cm$^2$. The lens is formed using the method for processing the lens forming material, using a photomask made of a fine dot pattern that cannot be resolved with a wavelength for forming the lens. Therefore it becomes possible to form a high quality and high performance lens capable of improving light focusing efficiency by obtaining a desired convex lens surface shape with a smooth surface shape in accordance with required performance of a device, with suitable reproducibility and at a low cost.

According to the present invention as described above, a lens forming material is used, in which the average gradient of the γ curve indicating the residual film thickness with respect to the amount of irradiation light is between −15 and −0.8 nm·cm$^2$/mJ within the range of a residual film ratio of 10 to 50% or within the range of the amount of irradiation light of 55 to 137 mJ/cm$^2$, to form the lens using the method for processing the lens forming material, using the photomask made of a fine dot pattern that cannot be resolved with a wavelength for forming the lens. Therefore it becomes possible to form a high quality and high performance microlens capable of improving light focusing efficiency by obtaining a desired convex lens surface shape with a smooth surface shape in accordance with the required performance of a device, with suitable reproducibility and at a low cost.

These and other advantages of the present invention will become apparent to those skilled in the art upon reading and understanding the following detailed description with reference to the accompanying figures.

Figure 1:
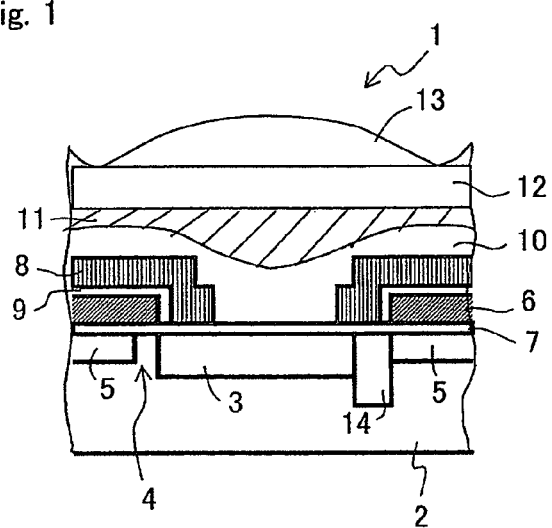
FIG. 1 is a longitudinal cross sectional view schematically illustrating an exemplary structure of an essential part of a CCD type solid-state image capturing element according to Embodiment 1 of the present invention.

1 solid-state image capturing element
2 semiconductor substrate
3 photoelectric conversion section
4 read-out gate section
5 transfer channel
6 gate electrode
7 gate insulation layer
8 light shielding layer
9 interlayer insulation layer
10 interlayer insulation layer (first transparent layer)
11 inner-layer lens (second transparent layer)
12 planarization layer (third transparent layer)
13 microlens
13a positive type photoresist material layer
14 channel stopper
20 photomask
30 light emitting element and light receiving element
80, 90 electronic information device
81 solid-state image capturing apparatus
82, 92 memory section
83, 93 display section
84, 94 communication section
85, 95 image output section
91 information recording and reproducing section

DESCRIPTION OF THE PREFERRED EMBODIMENTS

Hereinafter, Embodiments 1 and 2 of the present invention will be described with reference to the accompanying figures. Embodiment 1 is regarding a method for manufacturing a solid-state image capturing element including a method for forming a microlens. Embodiment 2 is regarding an electronic information device, such as a camera-equipped cell phone device, including the solid-state image capturing element, which uses therein a microlens formed using the method for forming a microlens, as an image input device used in an image capturing section thereof. Note that the thickness, length and the like of the constituent members in the respective figures are not limited to the configuration illustrated therein from the perspective of drawing the figures.

Embodiment 1

FIG. 1 is a longitudinal cross sectional view schematically illustrating an exemplary structure of an essential part of a CCD type solid-state image capturing element according to Embodiment 1 of the present invention.

In FIG. 1, a solid-state image capturing element 1 as a semiconductor apparatus of Embodiment 1 includes a photoelectric conversion section 3, a read-out gate section 4, a transfer channel 5, and a channel stopper 14, all of which are provided in this order on a front surface side of a semiconductor substrate 2 per each pixel. In addition, a gate electrode 6 is provided above the read-out gate section 4 and transfer channel 5 with a gate insulation layer 7 interposed therebetween.

The photoelectric conversion section 3 converts incident light to an electric signal and/or converts an electric signal to light. In the present embodiment, a plurality of light receiving sections for performing a photoelectric conversion on and capturing an image of incident light, for example, a plurality of p-n junction diodes, are formed in a matrix on the front surface side of the semiconductor substrate 2. Incident light entering the photoelectric conversion section 3 is photoelectrically converted to a signal charge. The photoelectrically converted signal charge in the photoelectric conversion section 3 is supplied to the transfer channel 5, which is a vertical electric charge transfer section provided on one side (left side in FIG. 1) of the photoelectric conversion section 3, through the read-out gate section 4. The signal charge supplied to the transfer channel 5 is transferred in a predetermined direction (from the vertical direction to the horizontal direction) within the transfer channel 5, and the signal charge is finally detected by a charge detection section (not shown). In accordance with a detected voltage thereof, the electric charge is amplified and output as an image capturing signal for each pixel. The channel stopper 14 is provided between an adjacent transfer channel 5 provided on the other side (right side in FIG. 1) of the photoelectric conversion section 3 and the photoelectric conversion section 3. Accordingly, the channel stopper 14 prevents the signal charge of the photoelectric conversion section 3 from crossing over to the adjacent transfer channel 5.

A light shielding layer 8 is provided above the gate electrode 6 with an interlayer insulation layer 9 interposed therebetween. The light shielding layer 8 is provided to prevent light from breaking through to an electric charge transferring section (transfer channel 5). An outer circumference edge portion above the photoelectric conversion section 3 is also covered by the light shielding layer 8. An opening is formed in the light shielding layer 8 above the photoelectric conversion section 3. That is, the upper part of the photoelectric conversion section 3 is optically opened, excluding the outer circumference edge portion above the photoelectric conversion section 3.

An interlayer insulation layer 10 is laminated on the gate insulation layer 7 and light shielding layer 8, wherein the interlayer insulation layer is formed of a BPSG layer as a first transparent layer. An inner-layer lens 11 for focusing light is formed on the interlayer insulation layer 10 in such a manner to be positioned above the photoelectric conversion section 3, wherein the inner-layer lens is formed of a high refractive, second transparent layer.

The inner-layer lens 11 is provided to focus light to the photoelectric conversion section 3. At least one of the lower surface and upper surface of the inner-layer lens 11 may be formed in a convex lens shape. In the present embodiment, a case is illustrated where only the lower surface is formed in a convex lens shape (downwardly convex).

A planarization layer 12 is provided as a third transparent layer for surface planarizing, covering the inner-layer lens 11. Prior to forming the planarization layer 12, a color filter (not shown) of a predetermined color arrangement (e.g., Bayer arrangement) in combination with red (R), green (G) and blue (B) as well as a protection film (not shown) thereon formed of a transparent organic film may be formed as necessary. In any case, a microlens 13 for focusing light to the photoelectric conversion section 3 is formed to be positioned above the photoelectric conversion section 3 and the inner-layer lens 11, while the inner-layer lens 11 is covered by a transparent layer (planarization layer 12 in FIG. 1).

A further detailed description will be provided with regard to the solid-state image capturing element 1 with the microlens 13 used therein and formed using the method for forming the microlens 13 according to Embodiment 1.

On the front surface side of the semiconductor substrate 2, the plurality of photoelectric conversion sections 3 for capturing an image of incident light are formed in a matrix as impurity diffusion regions. The semiconductor substrate 2 is not normally limited to a specific type of substrate as long as such a substrate is used for the manufacture of a semiconductor apparatus. For example, a usable substrate is formed of a semiconductor such as silicon or germanium, or a compound semiconductor such as SiC, GaAs, or AlGaAs. It is particularly preferable to use a silicon substrate. The semiconductor substrate 2 is normally doped with n-type or p-type impurities as impurity diffusion regions; however, one or more n-type or p-type well regions may be further included. In addition, impurity diffusion regions, such as an electric charge transfer region, an element separation region, a contact region or a channel stopper region, containing high concentration n-type or p-type impurities may be formed on the surface of the semiconductor substrate 2, in addition to the photoelectric conversion section 3 (light emitting section or light receiving section) as illustrated in FIG. 1. Further, another semiconductor apparatus or circuit (e.g., peripheral driving circuit for the driving of reading out signal charge and transferring signal charges in an image capturing region) may be combined to be provided.

A light receiving section and/or a light emitting section are mentioned as the photoelectric conversion section 3, and the photoelectric conversion section 3 is used as a light receiving section herein. A p-n junction diode (photodiode), for example, which is formed on the surface of the semiconductor substrate 2, can be mentioned as the light receiving section thereof functioning as the photoelectric conversion section 3. In the p-n junction diode, the size, shape and number of a p-type or n-type impurity layer as well as the impurity concentration of the impurity layer and the like may be set appropriate in accordance with the required performance of the semiconductor apparatus. As for the light emitting section, a light emitting diode element and a semiconductor laser element, for example, can be mentioned. As for a method for forming an impurity diffusion region to form the photoelectric conversion section 3 on the front surface side of the semiconductor substrate 2, any well-known method can be used. For example, a photomask of a predetermined pattern with an opening for a desired region of the semiconductor substrate 2 can be formed using a photolithography and etching step, and ions are implanted in a predetermined region of the semiconductor substrate 2 corresponding to the opening, using the photomask. As a result, the plurality of photoelectric conversion sections 3 can be formed, arranged in a matrix.

In the case of a CCD, for example, the gate electrode 6 is normally formed above the semiconductor substrate 2 in between adjacent photoelectric conversion sections 3 (light receiving sections herein) with the gate insulation layer 7 interposed therebetween. The light shielding layer 8 is formed above the gate electrode 6 with the interlayer insulation layer 9 interposed therebetween. The material of the gate electrode 6 is not particularly limited, provided that such a material is suitable as an electrode. For example, polycrystalline silicon, tungsten silicon and the like can be mentioned. The thickness of the gate electrode 6 is not particularly limited, for example, 300 to 600 nm, can be mentioned. The material and thickness of the light shielding layer 8 is not particularly limited, provided that such a material and thickness can substantially completely shield visible light and/or infrared rays. For example, the light shielding layer 8 can be formed of a metal or alloy layer, such as tungsten silicide and titanium tungsten, with a thickness of about 100 to 1000 nm.

The material of the gate insulation layer 7 and interlayer insulation layer 9 are not limited, provided that such a material is normally used for the layer. For example, a single layer or multiple layers of: a plasma TEOS (Tetra-Ethoxy Silane) layer, LTO (Low Temperature Oxide) layer, HTO (High Temperature Oxide) layer and NSG (None-Doped Silicate Glass) layer using a CVD (Chemical Vapor Deposition) method, or an SOG (Spin On Glass) layer applied and formed using a spin coating method, or a silicon nitride layer using a CVD method can be mentioned.

Further, above the semiconductor substrate 2 and above the photoelectric conversion section 3 (light receiving section), the interlayer insulation layer 10 is formed as a first transparent layer having a concave portion on the upper surface owing to concave and convex shapes created by the gate electrode 6 and light shielding layer 8 as well as the gate insulation layer 7 on the photoelectric conversion section 3. However, the interlayer insulation layer 10 does not necessarily have a concave portion, the surface of the transparent interlayer insulation layer 10 may be planar. The first transparent layer preferably has a transmittance factor of about 80 to 100 percent, depending on its material and thickness. As for the material of the first transparent layer, the single layer or multiple layers exemplified as the insulation layer above can be mentioned. In particular, a BPSG layer is preferable.

The gate insulation layer 7, interlayer insulation layer 9, gate electrode 6, light shielding layer 8, and the first transparent layer of interlayer insulation layer 10 can be formed by selecting an appropriate method that is well-known in the subject field, including sputtering method, various kinds of CVD methods such as decompression CVD method, normal pressure CVD method and plasma CVD method, as well as spin coating method, vacuum vapor deposition method and EB method.

The inner-layer lens 11 is formed on the surface of the interlayer insulation layer 10 as the first transparent layer, and then, if necessary, a planarization layer such as a transparent layer of a thermosetting acrylic resin or the like may be generally formed to form a color filter thereon, in order to improve the close adhesion with a later-formed color filter and to planarize the base. The planarization layer 12, which is a transparent layer, is formed on the color filter or the inner-layer lens 11. The microlens 13 is formed on the planarization layer 12, aligned in relation to the photoelectric conversion section 3. As described above, a planarization layer and a color filter and further one or more kinds of layers which function as a protection film and an interlayer insulation layer, can be formed between the inner-layer lens 11 and the planarization layer 12, with any material and any thickness.

Figure 4:
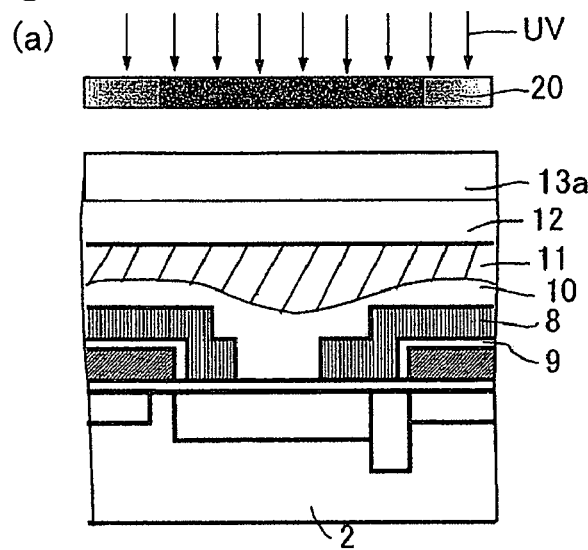
FIGS. 4(a) and 4(b) are each a longitudinal cross sectional view schematically illustrating a microlens forming step following the inner-layer lens and planarization layer forming step of FIG. 3(c).
Figure 4:
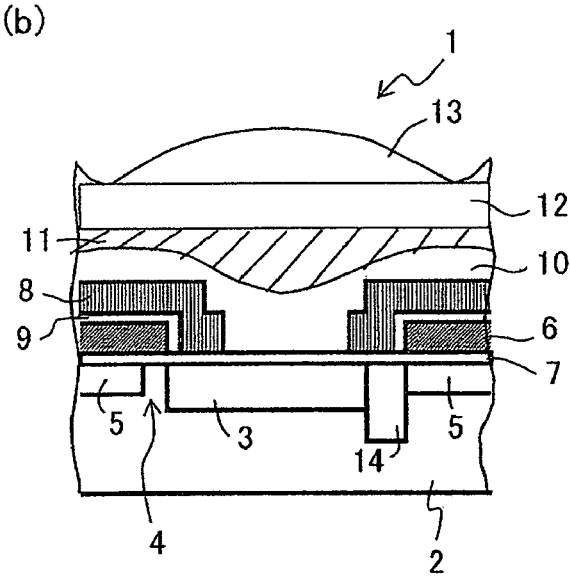

In the case of forming the microlens 13, a photomask 20, which will be later described with reference to FIG. 4(*a*), is used as an exposure mask. The photomask 20 has an optical transmittance that is varied according to the lens surface shape of the microlens 13. Further, a positive type photosensitive resist material with an average gradient of γ curve of $-15$ to $-0.8$ nm·cm$^2$/mJ within the range of a residual film ratio of 10 to 50% is used as a microlens forming material. Reference 3 and the like disclose such a method for manufacturing the above-described photomask 20, as described previously. The photomask 20 is made of a dot pattern that is finer than an exposure wavelength of 365 nm, and cannot be resolved with an i-ray of a 365 nm exposure wavelength for forming the microlens 13.

In addition, it is necessary for the average gradient of γ curve (residual film thickness with respect to the amount of irradiation light) of the microlens forming material used herein to be $-15$ to $-0.8$ nm·cm$^2$/mJ within the range of a residual film ratio of 10 to 50%. If a material outside the range, for example, a material with an average gradient of γ curve of $-17.7$ nm·cm$^2$/mJ within the range of a residual film ratio of 10 to 50%, is used, the variation of the residual film thickness becomes too large with respect to the variation of the amount of irradiation light, which makes it impossible to obtain a desired convex shape microlens 13 with a smooth surface shape as illustrated in FIG. 1. Such a variation of the residual film thickness becoming too large will result in a poorly shaped microlens such as the microlens 132 illustrated in FIG. 9.

Figure 2:
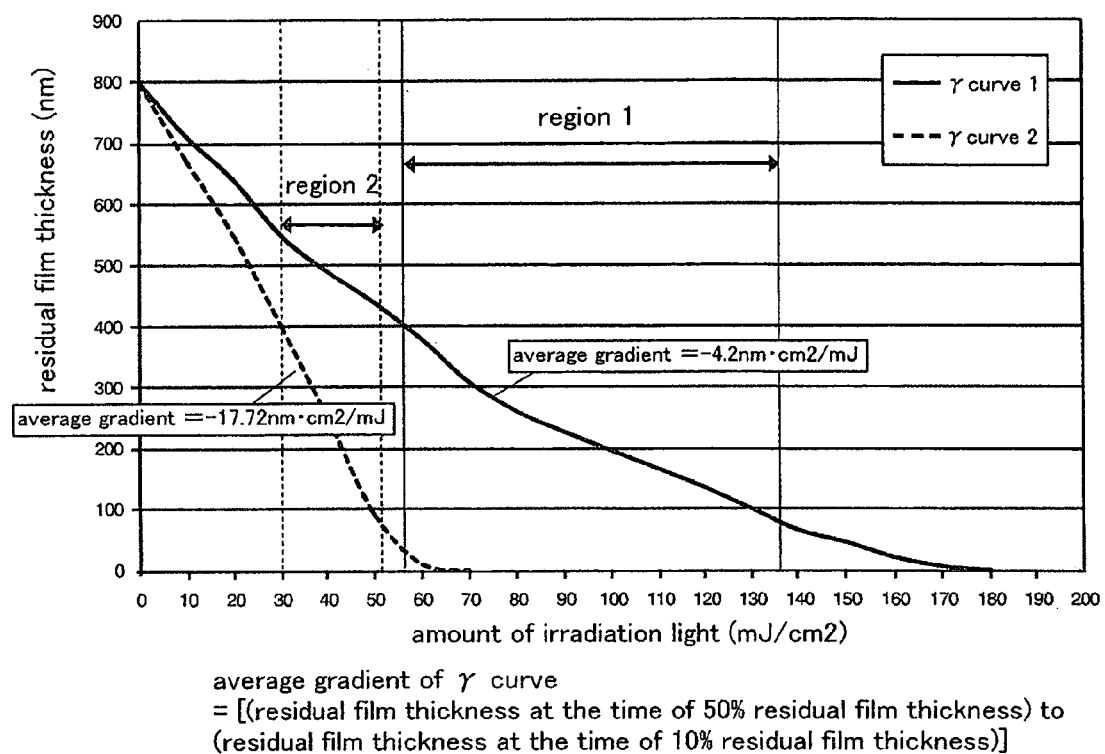
FIG. 2 is a graph illustrating a γ curve of a positive type photosensitive resist material.

FIG. 2 is a graph illustrating a γ curve of a positive type photosensitive resist material.

FIG. 2 illustrates a γ curve 1 in which an average gradient of γ curve (residual film thickness with respect to the amount of irradiation light) of a microlens forming material is $-4.2$ nm·cm$^2$/mJ between $-15$ and $-0.8$ nm·cm$^2$/mJ within the range of a residual film ratio of 10 to 50%. With a microlens forming material having the γ curve 1, it becomes possible to obtain a desired convex shape microlens 13 with a smooth surface. As illustrated in FIG. 2, 10 to 50% of the residual film thickness of 800 nm corresponds to the residual film thickness of 80 to 400 nm, and the amount of irradiation light is 55 to 135 cm$^2$/mJ in the region 1, which corresponds to the γ curve 1. Alternatively, it can be said that the microlens forming material illustrated herein is a positive type photosensitive resist material, in which an average gradient of the γ curve (residual film thickness with respect to the amount of irradiation light) of a positive type photosensitive resist material is between $-15$ and $-0.8$ nm·cm$^2$/mJ within the range of the amount of irradiation light of 55 to 137 mJ/cm$^2$.

In the meantime, in the case of the γ curve 2 in which an average gradient of the γ curve (residual film thickness with respect to the amount of irradiation light) of a microlens forming material deviates to be $-17.7$ nm·cm$^2$/mJ from the range of between $-15$ and $-0.8$ nm·cm$^2$/mJ within the range of a residual film ratio of 10 to 50%, it can be said that 10 to 50% of the residual film thickness of 800 nm corresponds to the residual film thickness of 80 to 400 nm, and the amount of irradiation light is 30 to 50 cm$^2$/mJ in the region 2, which corresponds to the γ curve 2.

As a result, the gradient of the γ curve 1 is gentler than that of the γ curve 2. Thus, in order to vary the residual film thickness of 80 to 400 nm, the amount of irradiation light varies from about 55 to 137 cm²/mJ in the γ curve 1 while it is about 30 to 50 cm²/mJ in the γ curve 2. The microlens forming material with the γ curve 1 can form the surface shape more accurately than the microlens forming material with the γ curve 2.

Figure 9:
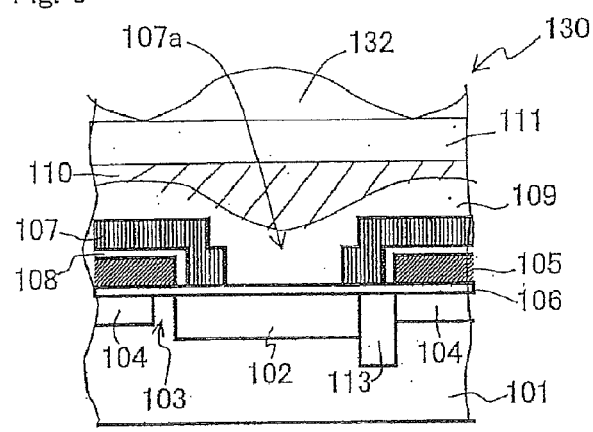
FIG. 9 is a longitudinal cross sectional view illustrating an exemplary structure of an essential part of a conventional CCD disclosed in Reference 3.

If the average gradient of the γ curve (residual film thickness with respect to the amount of irradiation light) of a microlens forming material deviates from the range of between −15 and −0.8 nm·cm²/mJ within the range of a residual film ratio of 10 to 50%, it will not be possible to obtain a desired convex shape microlens 13 with a smooth surface in accordance with the required performance of a device, an undesired example thereof is illustrated as the microlens 132 in FIG. 9.

More preferably, the average gradient of the γ curve of the microlens forming material is between −15 to −2 nm·cm²/mJ within the range of a residual film ratio of 10 to 50%. Still more preferably, the average gradient of the γ curve of the microlens forming material is between −10 to −2 nm·cm²/mJ within the range of a residual film ratio of 10 to 50%. In addition, the average gradient of the γ curve of the microlens forming material can be between −15 to −3 nm·cm²/mJ within the range of a residual film ratio of 10 to 50%.

Hereinafter, a method for manufacturing a CCD type solid-state image capturing element 1, including an example of the method for forming the microlens 13 according to Embodiment 1, will be described with reference to the accompanying figures. Materials and apparatuses used in manufacturing steps of ordinary semiconductor apparatuses can be used, without any pre-treatment or further modification, as the materials and apparatuses mentioned in the following description. Thus, the detailed discussion of such materials and apparatuses will be omitted herein.

Figure 3:
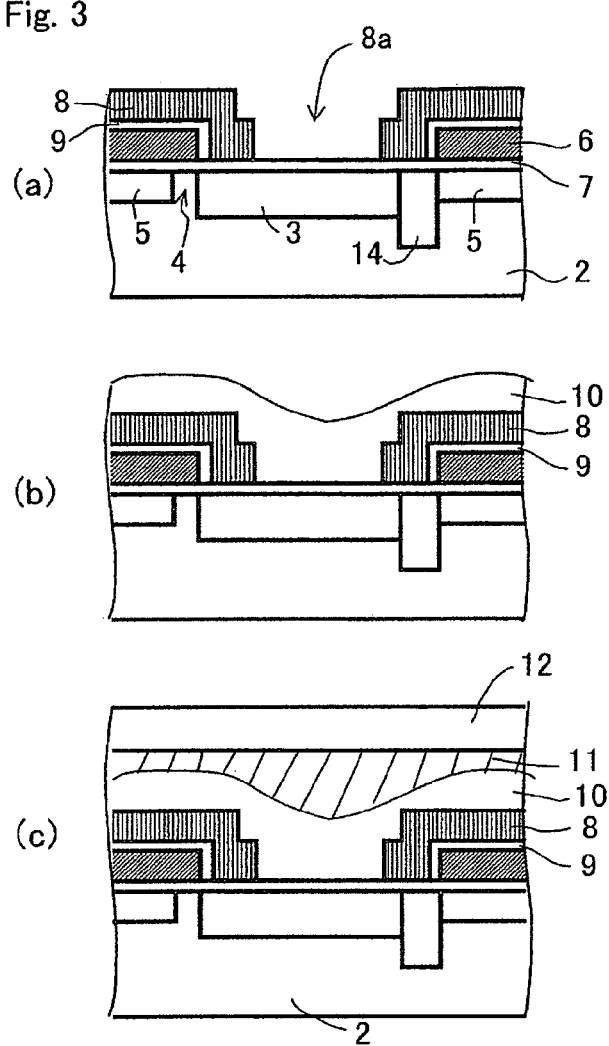
FIGS. 3(a) to 3(c) are each a longitudinal cross sectional view schematically illustrating each manufacturing step up to an inner-layer lens and planarization layer forming step, for describing a method for manufacturing the CCD type solid-state image capturing element in FIG. 1.

FIGS. 3(a) to 3(c) are each a longitudinal cross sectional view schematically illustrating each manufacturing step up to an inner-layer lens and planarization layer forming step, for describing the method for manufacturing the CCD type solid-state image capturing element 1 in FIG. 1. FIGS. 4(a) and 4(b) are each a longitudinal cross sectional view schematically illustrating a microlens forming step following the inner-layer lens and planarization layer forming step of FIG. 3(c). Herein, one pixel structure of the CCD is illustrated.

First, as illustrated in an image capturing element forming step of FIG. 3(a), a predetermined impurity ion implantation and the like is performed on the semiconductor substrate 2. Then, the photoelectric conversion section 3, read-out gate section 4, transfer channel 5, and channel stopper 14 are formed in this order on a front surface side of the semiconductor substrate 2 per each pixel.

Next, the gate insulation layer 7 of a silicon oxide layer or the like is formed by thermal oxidation, for example, on the front surface side of the semiconductor substrate 2. The gate electrode 6 (transfer electrode) of a predetermined pattern and made of a polysilicon material is formed above the read-out gate section 4 and transfer channel 5 with the gate insulation layer 7 interposed therebetween. Further, the light shielding layer 8 is formed above the gate electrode 6 with the interlayer insulation layer 9 interposed therebetween, with a metal material such as tungsten silicide. The light shielding layer 8 is formed in such a manner to cover the sides of the upper surface and end surface of the gate electrode 6 and to have the opening 8a above the photoelectric conversion section 3.

Further, as illustrated in FIG. 3(b), a BPSG layer material is accumulated to reach the thickness of 600 nm using a normal pressure CVD method, covering the concave and convex portions of the gate insulation layer 7 and light shielding layer 8. In this case, the concentration of phosphorus and boron contained in the BPSG layer and the temperature of reflow to be performed later may be adjusted to have a smooth surface and a concave portion above the photoelectric conversion section 3. In Embodiment 1, the concentration of phosphorus and boron is set to 4.2 wt % (percent by weight) and 3.8 wt % (percent by weight) respectively.

Thereafter, the reflow temperature is set to be 950° C. and a thermal treatment is performed for twenty minutes to form the transparent interlayer insulation layer 10 of the BPSG layer having a concave portion above the photoelectric conversion section 3, on the gate insulation layer 7 and the light shielding layer 8.

Further, as illustrated in the inner-layer lens and planarization layer forming step of FIG. 3(c), a transparent layer, which is a $Si_3N_4$ layer having the thickness of 600 nm, is formed above the transparent interlayer insulation layer 10 by using a reaction gas in which a minute amount of $O_2$ is added to $NH_3$ and $SiH_4$ to form the inner-layer lens 11 made of a high refractive transparent layer, in such a manner that the concave port ion (downwardly convex shape) of the lens shape is positioned above the photoelectric conversion section 3. Further, the planarization layer 12 is formed on the inner-layer lens 11 as a transparent layer with its surface planarized.

Thereafter, as illustrated in a microlens forming step of FIG. 4(a), a positive type photoresist layer 13a is applied on the planarization layer 12; and the photoresist layer 13a has the average gradient of γ curve 1 of −4.2 nm·cm²/mJ between the average gradient of γ curve (residual film thickness with respect to the amount of irradiation light) of −15 to −0.8 nm·cm²/mJ of the microlens forming material within the range of a residual film ratio of 10 to 50%. A photomask with a fine dot pattern, or a dot pattern of the size of 60×60 nm square unit after exposure in this case is used and exposure and development is performed using an i-ray exposure apparatus for patterning. Further, if necessary, thus obtained entire resist pattern is irradiated with infrared rays including i-ray for ten seconds using an infrared ray irradiating apparatus, and the entire resist pattern is dried for one minute by thermal treatment of 150° C. As a result, as illustrated in FIG. 4(b), the microlens 13 with an upwards convex shape is formed.

This microlens forming step is to process a lens forming material, in which the average gradient of the γ curve of the photoresist layer 13a (positive type photosensitive resist material) of FIG. 4(a) illustrating a residual film thickness with respect to the amount of irradiation light is between −15 and −0.8 nm·cm²/mJ within the range of a residual film ratio of 10 to 50%, to a lens surface shape, using the photomask 20 as an exposure mask which has an optical transmittance that is varied according to the lens surface shape of the microlens 13, in a method for forming the microlens 13, which enables focusing light on the photoelectric conversion section 3 as an electronic element of a semiconductor apparatus.

According to Embodiment 1 of the present invention as described above, a lens forming material is used, in which the average gradient of the γ curve indicating the residual film thickness with respect to the amount of irradiation light is between −15 and −0.8 nm·cm²/mJ within the range of a residual film ratio of 10 to 50% or within the range of the amount of irradiation light of 55 to 137 mJ/cm². The lens is formed using the method for processing the lens forming material, using the photomask 20 made of a fine dot pattern that cannot be resolved using the wavelength for forming the microlens 13. Therefore it becomes possible to form a high quality and high performance microlens 13 capable of improving a light focusing efficiency by obtaining a desired convex lens surface shape with a smooth surface shape in accordance with the required performance of a device, with suitable reproducibility and at a low cost. As a result, it becomes possible to form a high quality and high performance microlens 13 without any null regions, with suitable reproducibility and at a low cost, wherein the microlens can meet the demands of increasing importance of the reduction of the null region during the light focusing by the microlens 13 for the advance of downsizing the solid-state image capturing element 1 and increasing the number of pixels.

In Embodiment 1, described is a case where the microlens 13 of the present invention is applied to the CCD type solid-state image capturing element 1 as an electronic element. Without the limitation to this, the microlens of the present invention can be applied to, for example, a solid-state image capturing apparatus including a CMOS type solid-state image capturing element, a liquid crystal display element as an electronic element, a light receiving element, a light emitting element (a photoelectric conversion section including a light-electricity conversion section and an electricity-light conversion section) and the like. Similar to the case of Embodiment 1, it becomes possible to obtain a semiconductor apparatus with a microlens of a desired lens shape, by appropriately adjusting the thickness and the like of the inner-layer lens 11, planarization layer 12, color filter (not shown), protection film (not shown), and microlens 13 and their forming conditions.

Embodiment 2

Figure 5:
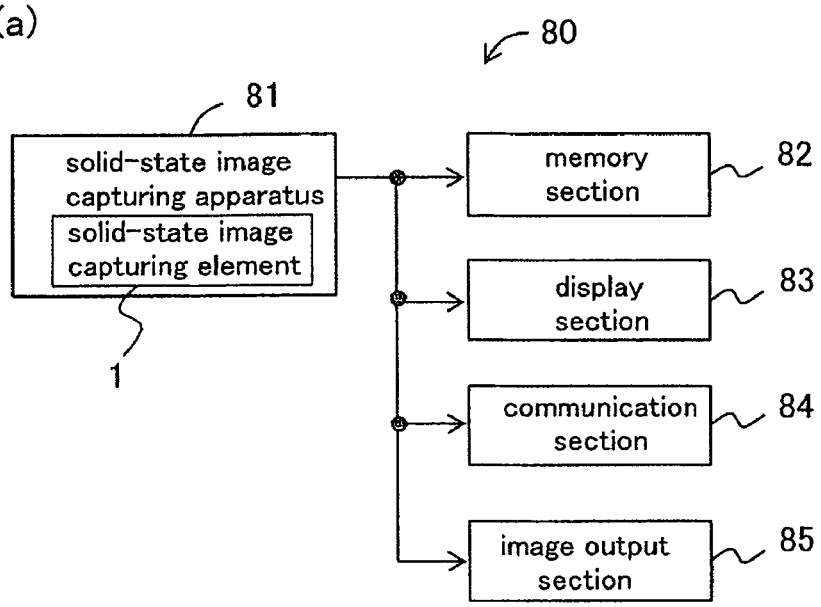
FIG. 5(a) is a block diagram illustrating an exemplary diagrammatic structure of an electronic information device as Embodiment 2 of the present invention, including the solid-state image capturing element according to Embodiment 1 of the present invention used in an image capturing section thereof.
FIG. 5(b) is a block diagram illustrating an exemplary diagrammatic structure of an electronic information device, such as a pick-up apparatus, including a light emitting element and light receiving element as an exemplary variation of Embodiment 2 used in an information recording and reproducing section thereof.
Figure 5:
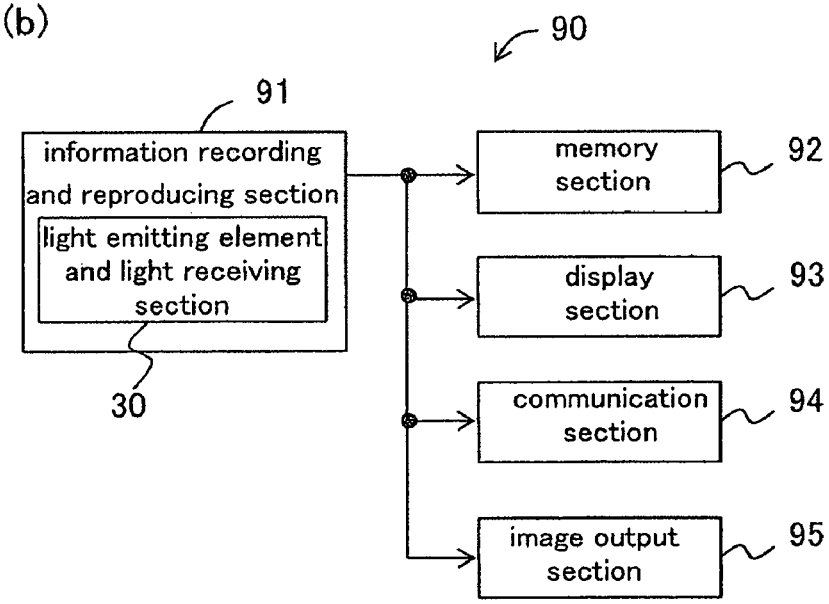
Figure 6:
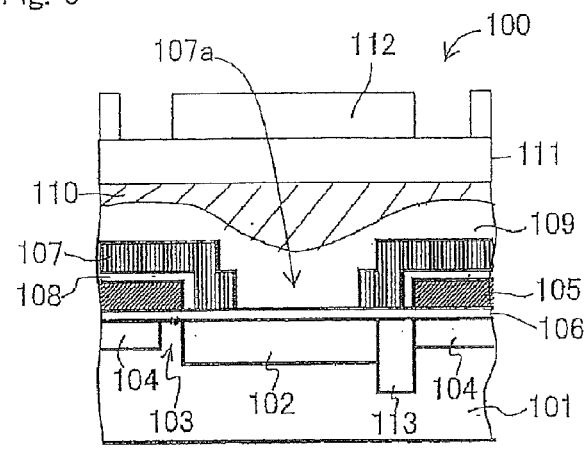
FIG. 6 is an essential part longitudinal cross sectional view illustrating a microlens forming step of a conventional CCD disclosed in Reference 1.
Figure 7:
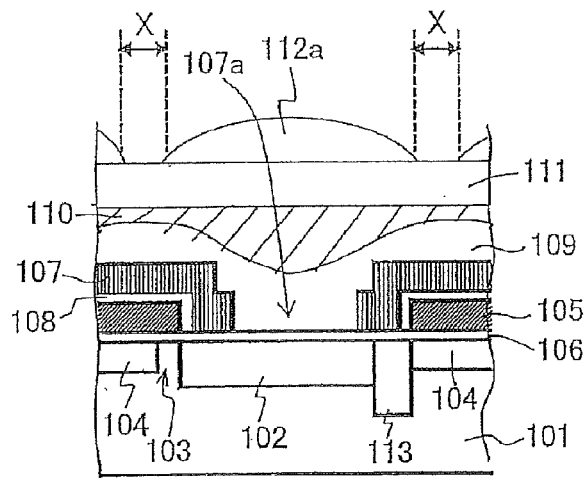
FIG. 7 is an essential part longitudinal cross sectional view of a CCD, illustrating a null region (distance X) between microlenses which are formed through the microlens forming step in FIG. 6.
Figure 8:
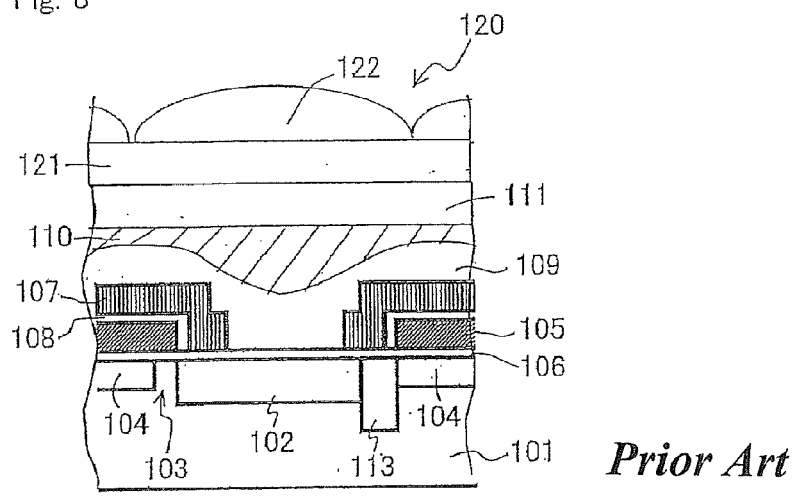
FIG. 8 is a longitudinal cross sectional view illustrating an exemplary structure of an essential part of a conventional CCD disclosed in Reference 2.

FIG. 5(a) is a block diagram illustrating an exemplary diagrammatic structure of an electronic information device as Embodiment 2 of the present invention, including the solid-state image capturing element 1 according to Embodiment 1 of the present invention used in an image capturing section thereof.

In FIG. 5(a), an electronic information device 80 according to Embodiment 2 of the present invention includes: a solid-state image capturing apparatus 81 for performing predetermined signal processing on an image capturing signal from the solid-state image capturing element 1 according to Embodiment 1 so as to obtain a color image signal; a memory section 82 (e.g., recording media) for data-recording the color image signal from the solid-state image capturing apparatus 81 after a predetermined signal process is performed on the color image signal for recording; a display section 83 (e.g., a liquid crystal display apparatus) for displaying the color image signal from the solid-state image capturing apparatus 81 on a display screen (e.g., liquid crystal display screen) after the predetermined signal processing is performed on the color image signal for display; a communication section 84 (e.g., a transmitting and receiving device) for communicating the color image signal from the solid-state image capturing apparatus 81 after the predetermined signal processing is performed on the color image signal for communication; and an image output section 85 (e.g., a printer) for printing the color image signal from the solid-state image capturing apparatus 81 after the predetermined signal processing is performed for printing. Without the limitation to this, the electronic information device 80 may include at least any of the memory section 82, the display section 83, the communication section 84, and the image output section 85 such as a printer, other than the solid-state image capturing apparatus 81.

For the electronic information device 80, an electronic device that includes an image input device is conceivable, such as a digital camera (e.g., digital video camera or digital still camera), an image input camera (e.g., a monitoring camera, a door phone camera, a camera equipped in a vehicle including a vehicle back view monitoring camera, or a television telephone camera), a scanner, a facsimile machine, a television telephone device, a camera-equipped cell phone device or a portable digital assistant (PDA).

Therefore, according to Embodiment 2 of the present invention, the color image signal from the sensor module 81 can be: displayed on a display screen properly; printed out on a sheet of paper using the image output section 85; communicated properly as communication data via a wire or a radio; stored properly at the memory section 92 by performing predetermined data compression processing; and further various data processes can be properly performed.

As illustrated in FIG. 5(b), without the limitation to the electronic information device 80 according to Embodiment 2, the electronic information device may be an electronic information device 90, such as a pick up apparatus, including a light emitting element and light receiving element 30 as an exemplary variation of a semiconductor apparatus of Embodiment 2 used in an information recording and reproducing section 91. In this case, an optical element of the pick up apparatus is an optical function element (e.g., hologram optical element) that directs output light straight to be output and refracting and guiding incident light in a predetermined direction, or a lens for outputting light from the light emitting element and a lens for focusing light on the light receiving element. In addition, an electronic element of the pick up apparatus includes a light emitting element (e.g., a semiconductor laser element or laser chip) for emitting output light on an optical disk and/or a light receiving element (e.g., photo IC) for receiving incident light which contains information from an optical disk.

The electronic information device 90, as an exemplary variation, according to Embodiment 2 of the present invention includes: an information recording and reproducing section 91 for performing predetermined signal processing on an output signal containing information from the light receiving element of the light emitting element and light receiving element 30 so as to obtain reproduction information; a memory section 92 (e.g., recording media) for data-recording the reproduction information from the information recording and reproducing section 91 after a predetermined signal process is performed on the reproduction information for recording; a display section 93 (e.g., a liquid crystal display apparatus) for displaying the reproduction information from the information recording and reproducing section 91 on a display screen (e.g., liquid crystal display screen) after the predetermined signal processing is performed on the reproduction information for display; a communication section 94 (e.g., a transmitting and receiving device) for communicating the reproduction information from the information recording and reproducing section 91 after predetermined signal processing is performed on the reproduction information for communication; and an image output section 95 (e.g., a printer) for printing the reproduction information from the information recording and reproducing section 91 after the predetermined signal processing is performed for printing. Without the limitation to this, the electronic information device 90 may include at least any of the memory section 92, the display section 93, the communication section 94, and the image output section 95 such as a printer, other than the information recording and reproducing section 91.

Although not particularly explained in the method for manufacturing a semiconductor apparatus according to Embodiment 1, the following steps may be included: a photoelectric conversion section forming step of forming a photoelectric conversion section 3 for each pixel by selectively performing impurity ion implantation on a predetermined region in a semiconductor substrate 2; a gate electrode forming step of forming a gate electrode 6 for transferring a signal charge from the photoelectric conversion section 3 on a predetermined region adjacent to the photoelectric conversion section 3 of the semiconductor substrate 2 with a gate insulation layer 7 interposed therebetween; a planarization layer forming step of forming a planarization layer 12 above the gate electrode 6 and the gate insulation layer 7 with an interlayer insulation layer 10 interposed therebetween; and a lens forming step of forming a microlens 13 on the planarization layer 12. Thereby the objective of the present invention can be achieved, the objective being forming a high quality and high performance microlens capable of improving light focusing efficiency by obtaining a desired convex lens surface shape with a smooth surface shape in accordance with the required performance of a device, with suitable reproducibility and at a low cost.

In this case, the lens forming step may process a lens forming material with an average gradient of the γ curve, which indicates residual film thickness with respect to the amount of irradiation light, between −15 and −0.8 nm·cm$^2$/mJ within the range of a residual film ratio of 10 to 50% into a lens surface shape, using a photomask with an optical transmittance that is varied according to the lens surface shape, as an exposure mask. Alternatively, the lens forming step may process a lens forming material with an average gradient of the γ curve, which indicates residual film thickness with respect to the amount of irradiation light, between −15 and −0.8 nm·cm$^2$/mJ within the range of the amount of irradiation light of 55 to 137 mJ/cm$^2$ into a lens surface shape, using a photomask with an optical transmittance that is varied according to the lens surface shape, as an exposure mask. The method for manufacturing a semiconductor apparatus according to Embodiment 1 may be the one for manufacturing either a CMOS type solid-state image capturing element including disposed therein a plurality of light receiving sections for performing a photoelectric conversion on and capturing an image of image light from a subject, or a CCD type solid-state image capturing element including disposed therein a plurality of light receiving sections for performing a photoelectric conversion on and capturing an image of image light from a subject.

The method for manufacturing a semiconductor apparatus according to Embodiment 1 will be further detailed. The method includes: a diffusion region forming step of forming, for each pixel, a photoelectric conversion section 3, a read-out gate section 4, a transfer channel section 5, and a channel stopper 14 in this order adjacent to each other by selectively performing impurity ion implantation on a predetermined region in the semiconductor substrate 2; a gate electrode forming step of forming a gate electrode 6 for reading out a signal charge from the photoelectric conversion section 3 through the read-out gate section 4 to the transfer channel section 5 for electric charge transferring, above the read-out gate section 4 and the transfer channel section 5 with a gate insulation layer 7 interposed therebetween; a light shielding layer forming step of forming a light shielding layer 8 which is formed above the gate electrode 6 with an interlayer insulation layer 9 interposed therebetween and covers the sides of the upper surface and the end surface of the gate electrode 6 and has an opening 8a above the photoelectric conversion section 3; a planarization layer forming step of forming a planarization layer 12 above the gate insulation layer 7 and the light shielding layer 8 with an interlayer insulation layer 10 interposed therebetween; and a lens forming step of forming a microlens 13 on a planarization layer 12.

In this case, the lens forming step may process a lens forming material with an average gradient of the γ curve, which indicates residual film thickness with respect to the amount of irradiation light, between −15 and −0.8 nm·cm$^2$/mJ within the range of a residual film ratio of 10 to 50% into a lens surface shape, using a photomask with an optical transmittance that is varied according to the lens surface shape, as an exposure mask. Alternatively, the lens forming step may process a lens forming material with an average gradient of the γ curve, which indicates residual film thickness with respect to the amount of irradiation light, between −15 and −0.8 nm·cm$^2$/mJ within the range of the amount of irradiation light of 55 to 137 mJ/cm$^2$ into a lens surface shape, using a photomask with an optical transmittance that is varied according to the lens surface shape, as an exposure mask. This method for manufacturing a semiconductor apparatus is the one for manufacturing a CCD type solid-state image capturing element including disposed therein a plurality of light receiving sections for performing a photoelectric conversion on and capturing an image of image light from a subject.

Additionally in Embodiment 1, a case has been described where included is an inner-layer lens forming step of forming an inner-layer lens 11 between the interlayer insulation layer 10 and the planarization layer 12 in the planarization layer forming step described above. However, without the limitation to this, an inner-layer lens forming step may be included for planarizing a surface of the interlayer insulation layer 10 in the planarization layer forming step described above to form a convex shaped inner-layer lens 11 on the planarized surface.

In this case, the inner-layer lens forming step may process an inner-lens forming material with an average gradient of the γ curve, which indicates residual film thickness with respect to the amount of irradiation light, between −15 and −0.8 nm·cm$^2$/mJ within the range of a residual film ratio of 10 to 50% into an inner-lens surface shape, using a photomask with an optical transmittance that is varied according to the lens surface shape, as an exposure mask. Alternatively, the inner-lens forming step may process an inner-lens forming material with an average gradient of the γ curve, which indicates residual film thickness with respect to the amount of irradiation light, between −15 and −0.8 nm·cm$^2$/mJ within the range of the amount of irradiation light of 55 to 137 mJ/cm$^2$ into an inner-lens surface shape, using a photomask with an optical transmittance that is varied according to the lens surface shape, as an exposure mask.

In addition, a color filter forming step may further be included for forming a color filter with a predetermined color arrangement and a planarization layer thereon between the planarization layer 12 and the microlens 13 for each pixel.

As described above, the present invention is exemplified by the use of its preferred Embodiments 1 and 2. However, the present invention should not be interpreted solely based on Embodiments 1 and 2 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 and 2 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of: a method for forming a microlens at a position corresponding to a photoelectric conversion section for converting light to an electric signal and/or converting an electric signal to light; a method for manufacturing a semiconductor apparatus such as a solid-state image capturing element, which uses the microlens formed using the method for forming a microlens and which is constituted of a plurality of light receiving sections for performing a photoelectric conversion on and capturing an image of incident light, as well as a light emitting section and a light receiving section; an electronic information device, such as a digital camera (e.g., a digital video camera or a digital still camera), an image input camera (e.g., a monitoring camera and a car-mounted camera), a scanner, a facsimile machine, a television telephone device, a camera-equipped cell phone device, which electronic information device includes the solid-state image capturing element, being the semiconductor apparatus manufactured using the method for manufacturing a semiconductor apparatus as an image input device used in an image capturing section thereof; or an electronic information device such as a pick-up apparatus, including the light emitting section and light receiving section as the semiconductor apparatus in an information recording and reproducing section thereof. According to the present invention, a lens forming material is used, in which the average gradient of the $\gamma$ curve indicating the residual film thickness with respect to the amount of irradiation light is between −15 and −0.8 nm·cm$^2$/mJ within the range of a residual film ratio of 10 to 50% or within the range of the amount of irradiation light of 55 to 137 mJ/cm$^2$. The lens is formed using the method for processing the lens forming material, using a photomask made of a fine dot pattern that cannot be resolved with a wavelength for forming the microlens. Therefore it becomes possible to form a high quality and high performance microlens capable of improving a light focusing efficiency by obtaining a desired convex lens surface shape with a smooth surface in accordance with the required performance of a device, with suitable reproducibility and at a low cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A lens forming step comprising method for forming lenses capable of focusing light on a plurality of respective photoelectric conversion sections constituting a semiconductor apparatus, the method comprising a lens forming step of processing a lens forming material, in which an average gradient of a $\Gamma$ curve indicating a residual film thickness with respect to an amount of irradiation light is between −15 and −0.8 nm-cm2/mJ within a range of a residual film ratio of 10 to 50% or within a range of an amount of irradiation light of 55 to 137 mJ/cm2 into a lens surface shape, using a photomask with an optical transmittance that is varied according to the lens surface shape, as an exposure mask.

2. The lens forming method according to claim 1, wherein the method uses the lens forming material, in which the average gradient of the $\Gamma$ curve is between −15 and −2 nm·cm2/mJ.

3. The lens forming method according to claim 1, wherein the method uses the lens forming material, in which the average gradient of the $\Gamma$ curve is between −10 and −2 nm·cm2/mJ.

4. The lens forming method according to claim 1, wherein the photomask is made of a dot pattern that is finer than an exposure wavelength, and cannot be resolved with the exposure wavelength used for forming the lens.

5. The lens forming method according to claim 4, wherein the exposure wavelength is an i-ray of a 365 nm exposure wavelength for forming the lens.

6. A method for manufacturing a semiconductor apparatus, comprising:
a diffusion region forming step of forming, for each pixel, a photoelectric conversion section, a read-out gate section, a transfer channel section, and a channel stopper section in this order adjacent to each other by selectively performing impurity ion implantation on a predetermined region in a semiconductor substrate;
a gate electrode forming step of forming a gate electrode for reading out a signal charge from the photoelectric conversion section through the read-out gate section to the transfer channel section for electric charge transferring, above the read-out gate section and the transfer channel section with a gate insulation layer interposed therebetween;
a light shielding layer forming step of forming a light shielding layer which is formed above the gate electrode with an interlayer insulation layer interposed therebetween and covers up to and including an end surface side of the gate electrode and has an opening above the photoelectric conversion section; a planarization layer forming step of forming a planarization layer above the gate insulation layer and the light shielding layer with an interlayer insulation layer interposed therebetween; and
forming a lens on the planarization layer by a lens forming step; wherein
the lens forming step comprising method for forming lenses capable of focusing light on a plurality of respective photoelectric conversion sections constituting a semiconductor apparatus, the method comprising a lens forming step of processing a lens forming material, in which an average gradient of a $\Gamma$ curve indicating a residual film thickness with respect to an amount of irradiation light is between −15 and −0.8 nm-cm2/mJ within a range of a residual film ratio of 10 to 50% or within a range of an amount of irradiation light of 55 to 137 mJ/cm2 into a lens surface shape, using a photomask with an optical transmittance that is varied according to the lens surface shape, as an exposure mask.

7. The method for manufacturing a semiconductor apparatus according to claim 6, further including an inner-layer lens forming step of forming an inner-layer lens between the interlayer insulation layer and the planarization layer in the planarization layer forming step.

8. The method for manufacturing a semiconductor apparatus according to claim 6, further including forming an inner-layer lens on a surface of the interlayer insulation layer in the planarization layer forming step after the surface is planarized, as an inner-layer lens forming step.

9. The method for manufacturing a semiconductor apparatus according to claim 6, further including a color filter forming step of forming, between the planarization layer and the lens, a color filter with a predetermined color arrangement and a planarization layer thereon for each pixel.

10. The method for manufacturing a semiconductor apparatus according to claim 6, wherein the method manufactures a CCD type solid-state image capturing element including disposed therein a plurality of light receiving sections for performing a photoelectric conversion on and capturing an image of image light from a subject.

11. An electronic information device including a solid-state image capturing element manufactured using the method for manufacturing a semiconductor apparatus according to claim 10, used as an image input device in an image capturing section thereof.

12. A method for manufacturing a semiconductor apparatus, comprising:
- a photoelectric conversion section forming step of forming a photoelectric conversion section for each pixel by selectively performing impurity ion implantation on a predetermined region in a semiconductor substrate;
- a gate electrode forming step of forming a gate electrode for transferring a signal charge from the photoelectric conversion section, on a predetermined region adjacent to the photoelectric conversion section of the semiconductor substrate with a gate insulation layer interposed therebetween;
- a planarization layer forming step of forming planarization layer above the gate electrode and the gate insulation layer with an interlayer insulation layer interposed therebetween; and
- forming a lens on the planarization layer by a lens forming step; wherein
- the lens forming step comprising method for forming lenses capable of focusing light on a plurality of respective photoelectric conversion sections constituting a semiconductor apparatus, the method comprising a lens forming step of processing a lens forming material, in which an average gradient of a $\Gamma$ curve indicating a residual film thickness with respect to an amount of irradiation light is between −15 and −0.8 nm-cm2/mJ within a range of a residual film ratio of 10 to 50% or within a range of an amount of irradiation light of 55 to 137 mJ/cm2 into a lens surface shape, using a photomask with an optical transmittance that is varied according to the lens surface shape, as an exposure mask.

13. The method for manufacturing a semiconductor apparatus according to claim 12, further including an inner-layer lens forming step of forming an inner-layer lens between the interlayer insulation layer and the planarization layer in the planarization layer forming step.

14. The method for manufacturing a semiconductor apparatus according to claim 12, further including forming an inner-layer lens on a surface of the interlayer insulation layer in the planarization layer forming step after the surface is planarized, as an inner-layer lens forming step.

15. The method for manufacturing a semiconductor apparatus according to claim 12, further including a color filter forming step of forming, between the planarization layer and the lens, a color filter with a predetermined color arrangement and a planarization layer thereon for each pixel.

16. The method for manufacturing a semiconductor apparatus according to claim 12, wherein the method manufactures a CMOS type solid-state image capturing element including disposed therein a plurality of light receiving sections for performing a photoelectric conversion on and capturing an image of image light from a subject.

17. An electronic information device including a solid-state image capturing element manufactured using the method for manufacturing a semiconductor apparatus according to claim 16, used as an image input device in an image capturing section thereof.

18. The method for manufacturing a semiconductor apparatus according to claim 12, wherein the method manufactures a CCD type solid-state image capturing element including disposed therein a plurality of light receiving sections for performing a photoelectric conversion on and capturing an image of image light from a subject.

19. An electronic information device including a solid-state image capturing element manufactured using the method for manufacturing a semiconductor apparatus according to claim 18, used as an image input device in an image capturing section thereof.

20. The method for manufacturing a semiconductor apparatus according to claim 12, wherein the method manufactures a light emitting element for emitting output light and a light receiving element for receiving incident light.

21. An electronic information device including a light emitting element and a light receiving element manufactured using the method for manufacturing a semiconductor apparatus according to claim 20, used in an information recording and reproducing section thereof.

* * * * *